(12) United States Patent
Kuroda et al.

(10) Patent No.: US 6,407,904 B1
(45) Date of Patent: *Jun. 18, 2002

(54) MULTI-LAYER CAPACITOR

(75) Inventors: Yoichi Kuroda; Yasuyuki Naito, both of Fukui; Masaaki Taniguchi, Fukui-ken; Haruo Hori; Takanori Kondo, both of Sabae; Michihiro Murata; Yoshitaka Tanino, both of Kyoto, all of (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/501,083

(22) Filed: Feb. 9, 2000

(30) Foreign Application Priority Data

May 10, 1999 (JP) .............................. 11-127908

(51) Int. Cl.[7] .................... H01G 4/005; H01G 4/228
(52) U.S. Cl. ................. 361/303; 361/306.3; 361/306.1; 361/308.1
(58) Field of Search .................... 361/301.1, 301.4, 361/306.1, 306.2, 306.3, 307, 308.1–308.3, 309, 310–312, 320, 321.1–321.5

(56) References Cited

U.S. PATENT DOCUMENTS

| | | | |
|---|---|---|---|
| 3,308,359 A | 3/1967 | Hayworth et al. | |
| 3,612,693 A | 10/1971 | Piper et al. | |
| 3,822,397 A | 7/1974 | Puppolo et al. | |

(List continued on next page.)

FOREIGN PATENT DOCUMENTS

| | | |
|---|---|---|
| DE | 25 45 672 | 4/1977 |
| EP | 0 191 668 | 8/1986 |
| FR | 1464631 | 11/1965 |

(List continued on next page.)

OTHER PUBLICATIONS

1991 Symposium on VLSI Technology, Digest of Technical Papers entitled Multilayer Vertical Stacked Capacitors (MVDTC) for 64 Mbit and 256 Mbit DRAMS by D. Temmler, Institute of Semiconductor Physics, Germany.

IBM Technical Disclosure Bulletin (vol. 31 No. 3 Aug. 1988).

IBM Technical Disclosure Bulletin (vol. 32, No. 6B Nov. 1989).

A paper entitled "Technical Information: Low Inductance Capacitors for Digital Circuits," by John Galvagni of AVX Corporation, Myrtle Beach, SC (No date provided.).

A paper entitled "Technical Information: Advanced Decoupling Using Ceramic MLC Capacitors," by John D. Prymak of AVX Corporation, Olean, NY (No date provided.).

40th Electronic Components & Technology Conference, 1990 Poster Presentations, vol. 2, May 20–23, 1990, Las Vegas, Nevada.

*Primary Examiner*—Dean A. Reichard
*Assistant Examiner*—Eric W. Thomas
(74) *Attorney, Agent, or Firm*—Keating & Bennett, LLP

(57) ABSTRACT

A multi-layer capacitor is constructed to minimize equivalent series inductance, increase resonance frequency, reduce the size of the capacitor and greatly improve the ease of mounting of the capacitor. A dimension in a length direction and a dimension in a width direction of a capacitor body are substantially equal, and a pattern of opposing first and second internal electrodes is substantially square. First lead-out portions of the first internal electrode and second lead-out portions of the second internal electrode are extended onto two side surfaces and two end surfaces. First external electrode terminals connected to the first lead-out portions and second external electrode terminals connected to the second lead-out portions are arranged so that they alternate adjacently and are arranged such that oppositely disposed external electrode terminals have opposite polarities.

36 Claims, 9 Drawing Sheets

U.S. PATENT DOCUMENTS

| | | | |
|---|---|---|---|
| 3,971,970 A | 7/1976 | Voyles et al. | |
| 4,074,340 A | 2/1978 | Leigh | |
| 4,274,124 A | 6/1981 | Feinberg et al. | |
| 4,295,183 A | 10/1981 | Miersch et al. | |
| 4,328,530 A | 5/1982 | Bajorek et al. | |
| 4,346,429 A | 8/1982 | DeMatos | |
| 4,419,714 A | 12/1983 | Locke | |
| 4,424,552 A | 1/1984 | Saint Marcoux | |
| 4,430,690 A | 2/1984 | Chance et al. | |
| 4,706,162 A | 11/1987 | Hernandez et al. | |
| 4,814,940 A | 3/1989 | Horstmann et al. | |
| 4,830,723 A | 5/1989 | Galvagni et al. | |
| 4,831,494 A | 5/1989 | Arnold et al. | |
| 4,852,227 A | 8/1989 | Burks | |
| 4,853,826 A | 8/1989 | Hernandez | |
| 4,862,318 A | 8/1989 | Galvagni et al. | |
| 5,517,385 A | 5/1996 | Galvagni et al. | |
| 5,880,925 A | 3/1999 | DuPre et al. | |
| 6,038,121 A * | 3/2000 | Naito et al. | 361/303 |
| 6,072,687 A * | 6/2000 | Naito et al. | 361/303 |
| 6,215,647 B1 * | 4/2001 | Naito et al. | 361/303 |
| 6,226,169 B1 * | 5/2001 | Naito et al. | 361/303 |
| 6,282,079 B1 * | 8/2001 | Nagakari et al. | 361/303 |

FOREIGN PATENT DOCUMENTS

| | | |
|---|---|---|
| FR | 2 707 123 | 6/1993 |
| JP | 02-159008 | 6/1990 |
| JP | 2-256216 | 10/1990 |
| JP | 4-42910 | 2/1992 |
| JP | 8-172026 | 6/1993 |
| JP | 6-140283 | 5/1994 |
| JP | 6-260364 | 9/1994 |
| JP | 07-201651 | 8/1995 |
| JP | 8-172026 | 7/1996 |

* cited by examiner

FIG. 1
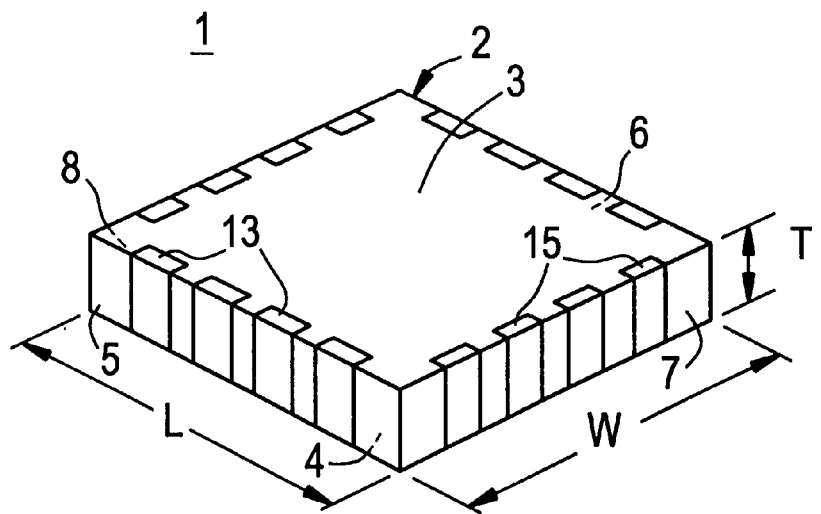
FIG. 2A
FIG. 2B
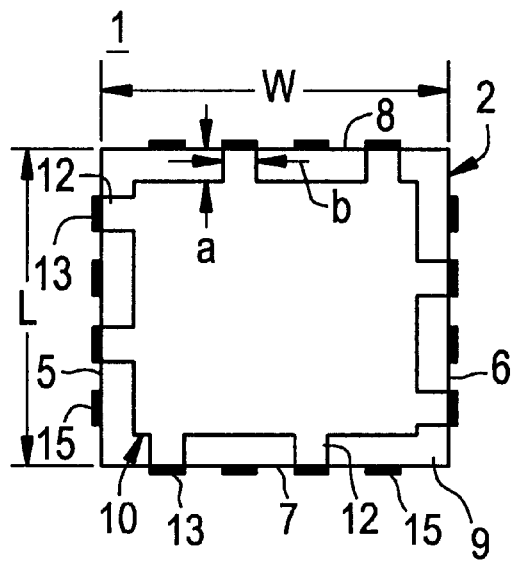
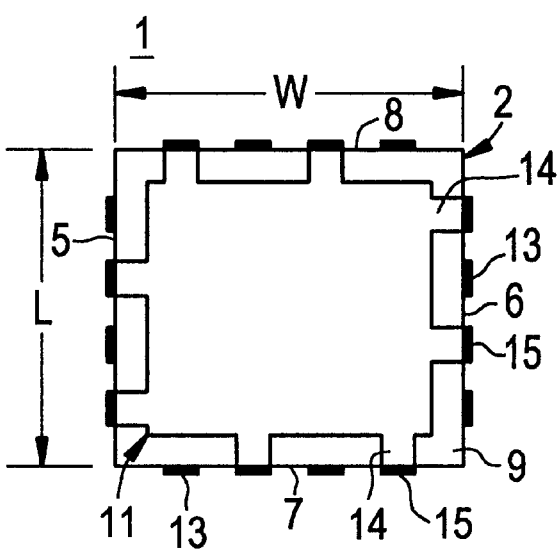

MULTI-LAYER CAPACITOR

BACKGROUND OF THE INVENTION

1. Field of the Invention

The present invention relates to a multi-layer capacitor and, more particularly, to a multi-layer capacitor that is constructed for use in high-frequency circuits.

2. Description of the Related Art

The most common multi-layer capacitor conventionally available is constructed of a ceramic dielectric material, for example, and includes a plurality of dielectric layers laminated with an internal electrode disposed therebetween. To construct a plurality of capacitors, a plurality of pairs of first and second internal electrodes are laminated with particular dielectric layers sandwiched therebetween in the direction of lamination. A capacitor is constructed in this manner.

First and second external terminal electrodes are respectively disposed on first and second end surfaces of the capacitor body. The first internal electrode has a lead extending to the first end surface of the capacitor body, and the lead is electrically connected to the first external terminal electrode. The second internal electrode has a lead extending to the second end surface of the capacitor body, and the lead is electrically connected to the second external terminal electrode.

In such a multi-layer capacitor, a current flows from the second external terminal electrode to the first external terminal electrode. More specifically, the current flows from the second external terminal electrode to the second internal electrode, and flows to the first internal electrode via a dielectric layer from the second internal electrode, and finally reaches the first external terminal electrode via the first internal electrode.

The equivalent circuit of the capacitor is a serial connection of C, L and R, where C represents the capacitance of the capacitor, L represents an equivalent series inductance (ESL), and R represents an equivalent resistance (ESR) which is mainly the resistance of the electrodes.

The equivalent circuit of the capacitor has a resonance frequency of $f_0 = 1/[(2\pi(LC)^{1/2}]$, and cannot work as a capacitor in a frequency range above the resonance frequency. In other words, the smaller the inductance L, more specifically ESL, is, the higher the resonance frequency $f_O$ becomes, and the capacitor accordingly can work on a higher frequency. Although constructing the internal electrode of copper to reduce ESR is contemplated, a capacitor having a small ESL is required if it is intended for use in a microwave range.

A low ESL is also required of a capacitor which is used as a decoupling capacitor connected to a power supply circuit which feeds power to a microprocessing unit (MPU) chip for use in a work station or a personal computer.

FIG. 15 is a block diagram showing an example of the configuration of the above-referenced MPU 31 and a power supply 32.

Referring to FIG. 15, MPU 31 includes an MPU chip 33 and a memory 34. The power supply 32 feeds power to the MPU chip 33. A decoupling capacitor 35 is connected in the power line that extends from the power supply 32 to the MPU chip 33. Signal lines are formed between the MPU chip 33 and the memory circuit 34.

Like an ordinary decoupling capacitor, the decoupling capacitor 35, associated with MPU 31, is used to absorb noise and smooth fluctuations in power supply voltage. Recently, the MPU chip 33 has an operating frequency of 500MHz or higher, and some chips reaching an operating frequency of 1 GHz are currently under development. In high-speed applications keeping pace with such an MPU chip 33, a quick power supply function is required of the capacitor. The quick power supply function is to feed power from the electricity stored in a capacitor within several nanoseconds when power is instantaneously required, such as during startup.

The MPU 31 thus needs a decoupling capacitor 35 having an inductance that is as low as possible, for example, 10 pH or lower. A capacitor having such a low inductance is therefore required for such a decoupling capacitor.

An MPU chip 33 having an operating clock frequency of 450 MHz is supplied with 1.8 volts to 2.0 volts DC, and its power consumption is 23 W, i.e., with a current of 12 A drawn. To reduce power consumption, the MPU 31 is set to operate in a sleep mode at a power consumption of 1W when it is not being used. When the MPU 31 is changed from the sleep mode to the active mode, the MPU chip 33 needs to be supplied with enough power for the active mode to start within several clock pulses. At the operating clock frequency of 450 MHz, power must be supplied within 4 to 7 nanoseconds when the sleep mode is switched to the active mode.

Since the power feeding from the power supply 32 is not fast enough, the charge stored in the decoupling capacitor 35 is placed in the vicinity of the MPU chip 33 is first discharged to feed power to the MPU chip 33 until the power feeding from the power supply 32 starts.

At an operating clock frequency of 1 GHz, the ESL of the decoupling capacitor 35 located in the vicinity of the MPU chip 33 needs to be 10 pH or smaller for the decoupling capacitor 35 to function in the manner described above.

The ESL of typical multi-layer capacitors ranges from 500 to 800 pH, which is far from the above-referenced value of 10 pH. Such an inductance component is created in the multi-layer capacitor because a magnetic flux, the direction of which is determined by a current flowing through the multi-layer capacitor, is created, and a self inductance is created due to the magnetic flux.

Under these situations, the structures of multi-layer capacitors that can achieve a low ESL have been proposed in U.S. Pat. No. 5,880,925, Japanese Unexamined Patent Publication 2-159008 and Japanese Unexamined Patent Publication No. 7-201651.

The above disclosed method of achieving a low ESL is heavily dependent on the cancellation of magnetic fluxes induced in the multi-layer capacitor. To cancel magnetic fluxes, the direction of a current flowing in the multi-layer capacitor is diversified. To diversify the direction of the current, the number of terminal electrodes disposed on the external surface of the capacitor body is increased so that the number of leads of internal electrodes connected to the respective external terminal electrodes is increased. At the same time, the leads of the internal electrodes are aligned in several directions.

The effectiveness of the proposed method of achieving a low ESL in the multi-layer capacitor is not sufficient.

For example, U.S. Pat. No. 5,880,925 and Japanese Unexamined Patent Publication No. 2-159008 discloses a structure in which the leads of internal electrodes extend to opposing sides of a capacitor body. It is estimated that such a structure achieves a low ESL of about 100 pH.

SUMMARY OF THE INVENTION

In order to overcome the problems described above, preferred embodiments of the present invention provide a multi-layer capacitor that has been improved to further effectively reduce ESL, to achieve a higher resonance frequency, to achieve a more compact device, to obtain a higher capacitance than previously was possible with conventional devices and to improve the ease of mounting of the capacitor.

These and other advantages are achieved by various preferred embodiments of the present invention.

For example, according to one preferred embodiment of the present invention, a multi-layer capacitor has a substantially square-shaped ceramic body including four sides having substantially equal dimensions and a plurality of external electrode terminals disposed on each of the four sides of the substantially square-shaped ceramic body.

It should be noted that the substantially square-shaped ceramic body and configuration of external electrode terminals in a manner that is symmetrical on each of the four sides, the capacitor can be mounted in any orientation on an electrode pattern provided on a printed circuit board. As a result, it is not necessary to accurately position and orient the capacitor on the printed circuit board, and thus, mounting of the capacitor is greatly simplified.

According to another preferred embodiment of the present invention, there are at least two of the external electrode terminals provided on each of the four sides of the substantially square-shaped ceramic body.

There may be two or more external electrode terminals disposed on each of the four sides of the substantially square-shaped body.

Further, in some preferred embodiments, only one pair or both pairs of opposite sides of the substantially square-shaped ceramic body may have an even number of external terminals. Alternatively, only one pair or both pairs of opposite sides of the substantially square-shaped ceramic body may have an odd number of external terminals.

It should also be noted that all four sides of the substantially square-shaped ceramic body may have an equal number of external electrodes, either odd or even in number. Alternatively, a first of the pair of opposite sides of the substantially square-shaped ceramic body may have an odd number of external electrodes and the other of the pair of opposite sides of the substantially square-shaped ceramic body may have an even number of external electrodes.

As will be described in more detail below, it is preferred that each of the external electrode terminals be disposed directly opposite to one of the external electrode terminals located on an opposite side of the substantially square-shaped ceramic body, across the substantially square-shaped ceramic body, to define respective pairs of directly oppositely disposed external electrode terminals. It is also preferred that each of the respective pairs of directly oppositely disposed external electrode terminals include a first polarity external electrode terminal and a second polarity external electrode terminal. That is, it is preferred that the external electrode terminals which are directly opposite to each other across the ceramic body have opposite polarities.

It should be noted that with respect to the above-described preferred embodiments, the external electrode terminals are electrically connected to respective lead out portions which extend from respective internal electrodes. The internal electrodes are opposed to each other in the substantially-square ceramic body with dielectric layers disposed therebetween.

The internal electrodes are arranged to define respective ones of a first polarity electrode including first polarity lead out portions and a second polarity electrode including second polarity lead out portions. The first polarity lead out portions extend from a main portion to edges of the substantially-square ceramic body and are electrically connected to respective ones of the first polarity external electrode terminals. The second polarity lead out portions extend from a main portion to edges of the substantially-square ceramic body and are electrically connected to respective ones of the second polarity external electrode terminals.

It should be noted that the arrangement of the first and second polarity lead-out portions correspond to the above-described arrangement of the corresponding ones of the first and second polarity external electrode terminals.

Also, it is preferred that the first polarity lead-out portions and the second polarity lead-out portions have the same dimensions including length and width. Further, it is preferred that the dimensions including length and width of main portions of the first and second polarity internal electrodes have the same shape and configuration.

According to yet another preferred embodiment of the present invention, a multi-layer capacitor includes a capacitor body that has a substantially quadrangular body defined by a dimension in a length direction, a dimension in a width direction, and a dimension in a thickness direction, the dimension in the length direction and the dimension in the width direction being substantially identical, the capacitor body having opposing first and second major surfaces defined by the dimension in the length direction and the dimension in the width direction, and having opposing first and second side surfaces defined by the dimension in the length direction and the dimension in the thickness direction, and opposing first and second end surfaces defined by the dimension in the width direction and the dimension in the thickness direction.

The capacitor body is provided with a plurality of dielectric layers extending toward the major surfaces and at least a pair of first and second internal electrodes that oppose each other via a particular one of the dielectric layers to define a capacitor unit. Each of the first and second internal electrodes has a substantially square pattern that includes sides extending substantially parallel to the first and second side surfaces, and the first and second end surfaces, respectively, of the capacitor body.

The first internal electrode has first lead-out portions that extend onto the first and second side surfaces and onto the first and second end surfaces. First external electrode terminals which are electrically connected to the first lead-out portions are provided on the first and second side surfaces and the first and second end surfaces, respectively, where the first lead-out portions are extended and exposed.

Furthermore, the second internal electrode has second lead-out portions that are extended onto the first and second side surfaces and onto the first and second end surfaces. Second external electrode terminals which are electrically connected to the second lead-out portions are provided on the first and second side surfaces and the first and second end surfaces, respectively, where the second lead-out portions are extended and exposed.

The first external electrode terminal and the second external electrode terminal are alternately disposed on the first and second side surfaces and the first and second end surfaces, respectively, and arranged such that opposite polarity terminals are directly opposite to each other across the capacitor body.

In one preferred embodiment of the present invention, each of the first and second side surfaces and each of the first and second end surfaces is provided with a plurality of first and second lead-out portions and first and second external electrode terminals.

In another preferred embodiment of the present invention, each of the first and second side surfaces and each of the first and second end surfaces is provided with a total of four or less of the first and second lead-out portions and the first and second external electrode terminals.

In another preferred embodiment of the present invention, a plurality of opposing portions of the first internal electrodes and the second internal electrodes are arranged to define a plurality of capacitor units connected in parallel by the first and second external electrode terminals.

Other features, elements, advantages and aspects of the present invention will be described in the following detailed description of preferred embodiments of the present invention with reference to the attached drawings, wherein like reference numerals indicate like elements.

BRIEF DESCRIPTION OF THE DRAWINGS

FIG. 1 is a perspective view of a multi-layer capacitor according to a preferred embodiment in accordance with the present invention.

FIG. 2 presents top plan views illustrating an internal structure of the multi-layer capacitor shown in FIG. 1, wherein FIG. 2A is a sectional view that includes a first internal electrode, and FIG. 2B is a sectional view that includes a second internal electrode.

DETAILED DESCRIPTION OF PREFERRED EMBODIMENTS

Figure 3:
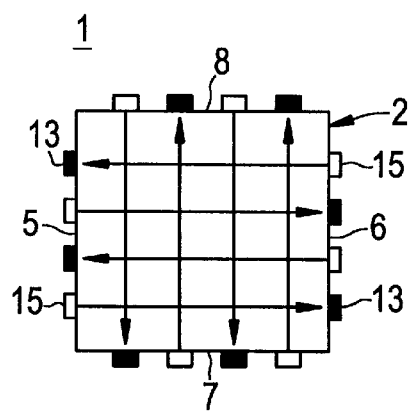
FIG. 3 is a top plan view schematically showing typical currents and directions thereof, which pass through the multi-layer capacitor shown in FIG. 1.

FIG. 1 through FIG. 3 will be used to describe a multi-layer capacitor 1 according to one of preferred embodiments of the present invention. FIG. 1 is a perspective view showing an appearance of the multi-layer capacitor 1. FIGS. 2A and 2B provide different sectional views of the multi-layer capacitor of FIG. 1. FIG. 3 is a top plan view showing via arrows, typical passages and directions of currents passing through the multi-layer capacitor 1.

The multi-layer capacitor 1 preferably includes a capacitor body 2 preferably having a substantially square shape including four substantially equal sides. It should be noted that the substantially square shape provides many advantages including reduced size and more compact configuration, as well as, allowing for an arrangement which substantially minimizes ESL generated in the capacitor, significantly increases a resonance frequency of the capacitor and increases capacitance.

In addition, when the capacitor body 2 has a substantially square shape and includes a symmetrical arrangement of external electrode terminals 13, 15, which will be described below and as shown in FIGS. 1–3, the capacitor 1 can be mounted in any orientation on an electric circuit pattern of a printed circuit board or the like. As a result, the capacitor does not have to be arranged according to a particular orientation on the printed circuit board, but can be mounted in any orientation, thereby greatly decreasing the mounting difficulty and process steps.

The substantially square shape of the capacitor body 2 is defined by a dimension L in a length direction, a dimension W in a width direction, and a dimension T in a thickness direction. The capacitor body 2 has a first major surface 3 and a second major surface 4 that are respectively defined by the dimension L in the length direction and the dimension W in the width direction and that are disposed opposite to each other. The capacitor body 2 also has a first side surface 5 and a second side surface 6 that are respectively defined by the dimension L in the length direction and the dimension T in the thickness direction and that are disposed opposite each other. In addition, the capacitor body 2 includes a first end surface 7 and a second end surface 8 that are respectively defined by the dimension W in the width direction and the dimension T in the thickness direction and that are disposed opposite to each other.

The capacitor body 2 preferably further includes a plurality of dielectric layers 9 and at least a pair of a first internal electrodes 10 and second internal electrodes 11 that oppose each other via a particular dielectric layer 9 so as to define a capacitor unit.

FIG. 2A is a sectional view that includes the first internal electrode 10, and FIG. 2B is a sectional view that includes the second internal electrode 11.

In the multi-layer capacitor 1, the dimension L in the length direction and the dimension W in the width direction are preferably substantially the same. Each of the first internal electrode 10 and the second internal electrode 11 preferably has a major portion having a substantially square pattern that has sides extending substantially parallel to the first side surface 5 and the second side surface 6, and the first end surface 7 and the second end surface 8 of the capacitor body 2. The first internal electrode 10 defines a first polarity internal electrode. The second internal electrode 11 defines a second polarity internal electrode.

Furthermore, referring to FIG. 2A, the first internal electrode 10 has first lead-out portions 12 that extend onto the first side surface 5 and the second side surface 6, and the first end surface 7 and the second end surface 8. The first lead-out portions 12 define first polarity lead-out portions.

First external electrode terminals 13 which are electrically connected to the first lead-out portions 12 are provided on each of the first side surface 5 and the second side surface 6, and the first end surface 7 and the second end surface 8 where the first lead-out portions 12 are extended and exposed. The first external terminal electrodes 13 define first polarity external terminal electrodes.

Referring to FIG. 2B, the second internal electrode 11 has second lead-out portions 14 extending onto the first side surface 5 and the second side surface 6, and the first end surface 7 and the second end surface 8. The second lead-out portions define second polarity lead-out portions.

Second external electrode terminals 15 which are electrically connected to the second lead-out portions 14 are provided on each of the first side surface 5 and the second side surface 6, and the first end surface 7 and the second end surface 8 where the second lead-out portions 14 are extended and exposed. The second external terminal electrodes 13 define second polarity external terminal electrodes.

Characteristics of a preferred arrangement of the first lead-out portion 12 and the second lead-out portion 14 and the first external electrode terminals 13 and the second external electrode terminals 15 in this preferred embodiment of the multi-layer capacitor 1 will be described below.

First, in this preferred embodiment, each of the first and second side surfaces 5 and 6 and the first and second end surfaces 7 and 8 is provided with at least two of the first and second lead-out portions 12 and 14, and the first and second external electrode terminals 13 and 15.

It should be noted however, that any number greater than two of the first and second lead-out portions 12 and 14, and the first and second external electrode terminals 13 and 15, including odd number and even number of such elements, and in any combination.

When the capacitor body 2 is observed in one direction in the order of the first side surface 5, the first end surface 7, the second side surface 6, and the second end surface 8, the first lead-out portions 12 and the second lead-out portions 14 are alternately positioned. Hence, the first external electrode terminals 13 and the second external electrode terminals 15 are arranged so that they alternate adjacently on the first and second side surfaces 5 and 6 and the first and second end surfaces 7 and 8, respectively.

Furthermore, the first external electrode terminals 13 and the second external electrode terminals 15 are arranged to be opposite to each other with the capacitor body 2 disposed therebetween.

That is, each of the first external electrode terminals 13 is preferably disposed directly opposite to one of the second external electrode terminals 15 located on an opposite side of the substantially square-shaped ceramic body, across the substantially square-shaped ceramic body, to define respective pairs of directly oppositely disposed external electrode terminals. It is also preferred that each of the respective pairs of directly oppositely disposed external electrode terminals include a first polarity external electrode 13 terminal and a second polarity external electrode terminal 15. That is, it is preferred that the external electrode terminals which are directly opposite to each other across the ceramic body have opposite polarities.

The configuration wherein the first and second lead-out portions 12 and 14, and the first and second external electrode terminals 13 and 15 are arranged as described above effectively cancels magnetic fluxes generated by currents passing through the multi-layer capacitor 1, thereby further minimizing ESL to levels well below those achieved by conventional devices described above.

Furthermore, the inventors discovered that the relationship between the length and width of the lead out portions relative to each other affects the results achieved by preferred embodiments shown in FIG. 1 and FIGS. 2(A), 2(B).

The length and width of the lead-out portions are designated by reference characters a and b, respectively, in FIGS. 2(A) and 2(B). In each of the preferred embodiments of the present invention, currents in the main portions of the first internal electrodes and the second internal electrodes flow in different directions, so that the generation of magnetic flux can be prevented. However, in the respective lead-out portions, currents flow in a uniform direction. As a result, a magnetic flux is generated, and an inductance component is generated in accordance with the magnetic flux. Further, the state of currents flowing in the respective main portions of the first internal electrodes and the second internal electrodes is changed, depending on the lengths and widths of the lead electrodes. Accordingly, the lengths and widths of the lead electrodes influence the ESL value.

To confirm this discovery, the lengths a and widths b of all of the lead-out portions of the preferred embodiment shown in FIG. 1 were varied. In one example of this preferred embodiment, the capacitor 1 contains a total of 16 lead-out portions in which four lead-out portions 12, 14 are extended onto each of the first side surface 5, the second side surface 6, the first end surface 7 and the second end surface 8.

TABLE 1 shows the results.

TABLE 1

|  | L = 0.1 mm | L = 0.2 mm | L = 0.3 mm | L = 0.5 mm |
| --- | --- | --- | --- | --- |
| W = 0.08 mm | 16 pH | 28 pH | 45 pH | 60 pH |
| W = 0.16 mm | 12 pH | 15 pH | 21 pH | 38 pH |
| W = 0.24 mm | 11 pH | 13 pH | 15 pH | 26 pH |

The numerical values listed in Table 1 are measured values of ESL obtained by the conventional resonance method. As seen by the results in Table 1, in the capacitors having plural lead-out portions, the ESL value is changed according to the ratio a/b. When the ratio a/b is about 3 or less, the ESL value is less than about 30 pH. When the ratio a/b is about 1.3 or less, the ESL value is less than about 20 pH.

The above-described preferred range of the ratio a/b can be applied to the structure in which a plurality of lead-out portions extending onto a pair of opposed side surfaces is even, and the number of lead-out portions extending onto the remaining pair of opposed side surfaces is even, without limitation to preferred embodiment described above. Moreover, the above-described preferred range of the ratio a/b can be applied to the structure in which the number of lead-out portions extending onto a pair of opposed side surfaces is even, and the number of lead-out portions extending onto the remaining pair of opposed side surfaces is odd. Furthermore, the above-described preferred range of the ratio a/b can be applied to the structure in which the number of lead-out portions extending onto a pair of opposed side surfaces is odd, and the number of lead-out portions extending onto the remaining pair of opposed side surfaces is odd.

Accordingly, in any of the possible configurations described above, when a/b is a value of 3 or lower, low ESL capacitors which have wide usefulness and excellent characteristics are achieved.

It is preferred that the ratio a/b is about 1.3 or less. In general, when lead-out portions are widened, currents can flow smoothly from the portions of capacitors where charges are accumulated, that is, the respective main portions of the first internal electrodes and the second internal electrodes into the lead-out portions. The reason is that when a/b is less than about 0.4, the lengths a of the lead-out portions are small and/or the widths b are large, and therefore, the deterioration of the electrical insulation and moisture-proof properties of the capacitors can not be neglected.

Further, in another preferred embodiment, the outer dimensions of each of the first internal electrodes and the second internal electrodes are substantially equal to each other and the lengths of all of the lead-out portions are substantially equal to each other. In this preferred embodiment, the lengths of all of the lead-out portions are preferably substantially equal, and can be reduced as much as possible. The static capacitance can also be made as large as possible. On the other hand, when the outer dimensions of the first internal electrodes are smaller than those of the second internal electrodes, the lengths of the lead-out portions connected to the first internal electrodes become relatively longer as compared with those of the second internal electrodes, which causes the ESL value to be increased as compared with the ESL value in other preferred embodiment of the present invention. In other words, the multi-layer capacitors of preferred embodiments of the present invention have a much lower ESL than capacitors having the structure in which the outer dimensions of the first and second internal electrodes are different from each other.

Referring to FIG. 3, currents flow from the second external electrode terminal 15 to the first external electrode terminal 13 in a manner as shown by the arrows of FIG. 3. In FIG. 3, the first external electrode terminals 13 are indicated in black, while the second external electrode terminals 15 are indicated in white.

With the preferred arrangement of the first and second external electrode terminals 13 and 15, adjacent currents passing substantially parallel to each other flow in opposite directions relative one another as can be seen from FIG. 3. Moreover, currents passing between the first and second side surfaces 5 and 6, and currents passing between the first and second end surfaces 7 and 8 are substantially perpendicular with respect to each other. Thus, magnetic fluxes generated by these currents can be effectively canceled, thus permitting lower ESL to be achieved to minimum levels far below those achieved conventionally.

In addition, as previously mentioned, the dimension L in the length direction and the dimension W in the width direction of the capacitor body 2 are substantially equal, and each of the internal electrodes 10 and 11 has the substantially square pattern. Hence, regarding passage lengths of the currents shown in FIG. 3, a current passage connecting the first and second side surfaces 5 and 6, and a current passage connecting the first and second end surfaces 7 and 8 share substantially the same passage length. Thus, by arranging the current passages to be substantially perpendicular to each other and substantially the same length, the cancellation of magnetic fluxes is further enhanced, thereby allowing for achievement of further reduced ESL beyond that conventionally possible.

Furthermore, the above-described unique arrangement of preferred embodiments of the present invention achieve a much higher resonance frequency as compared to that of conventional devices. As a result of such higher resonance frequencies, the capacitor according to preferred embodiments of the present invention performs at much higher frequencies without resonating, thus becoming excellent for use with electronic circuits designed for higher frequencies.

Furthermore, as seen in FIGS. 1–3, the substantially square shape of the capacitor body 2 and the symmetrical arrangement of the external electrode terminals 13, 15 allow the capacitor 1 to be mounted in any orientation on an electric circuit pattern of a printed circuit board or the like. This greatly reduces the time and cost required to mount the capacitor on a substrate and connect the capacitor as desired to an electric circuit pattern.

In order to verify these advantages and significant improvements over conventional devices, the following experiment was performed.

FIG. 4 through FIG. 7, which are similar to FIG. 3, illustrate multi-layer capacitors 21 through 24 which were manufactured for the experiment. In FIG. 4 through FIG. 7, all capacitor bodies are indicated by reference numeral 25, first side surfaces are indicated by reference numeral 26 and second side surfaces 27, first end surfaces are indicated by reference numeral 28 and second end surfaces 29, and first external electrode terminals are indicated by 30 and second external electrode terminals by 31.

Figure 4:
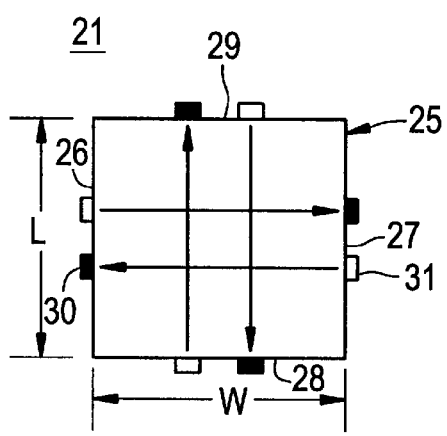
FIG. 4 shows a multi-layer capacitor according to a preferred embodiment of the present invention which was manufactured in an experiment conducted for verifying advantages of the present invention.
Figure 5:
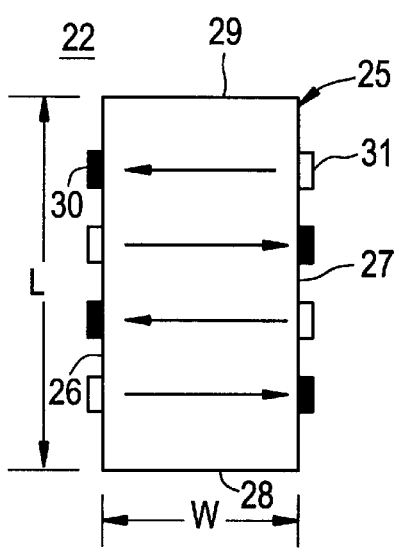
FIG. 5 shows a multi-layer capacitor providing a comparative example for comparison to the experimental device of FIG. 4.
Figure 6:
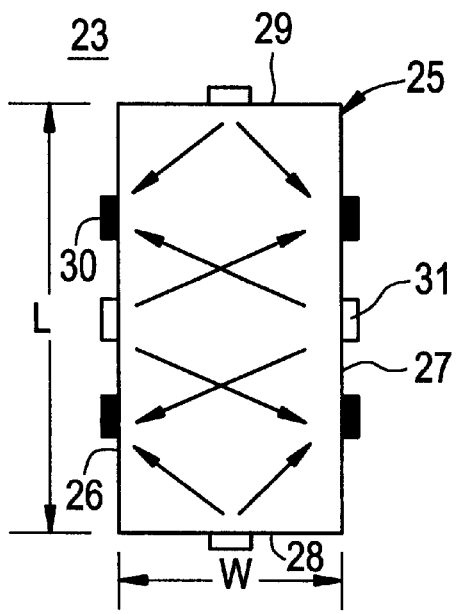
FIG. 6 shows a multi-layer capacitor providing another comparative example for comparison to the experimental device of FIG. 4.
Figure 7:
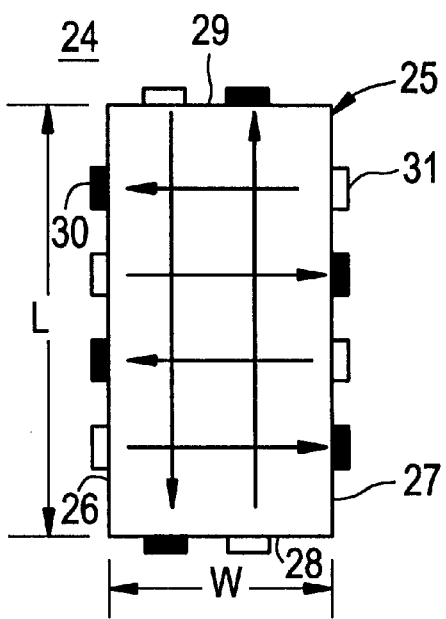
FIG. 7 shows a multi-layer capacitor providing yet another comparative example for comparison to the experimental device of FIG. 4.

In the experiment, the multi-layer capacitor 21 shown in FIG. 4 indicates a preferred embodiment of the present invention. Multi-layer capacitors 22 through 24 shown in FIG. 5 through FIG. 7 are comparative examples constructed for comparison to the example of the preferred embodiments shown in FIG. 4.

In the multi-layer capacitor 21 shown in FIG. 4, the dimension L in the length direction and the dimension W in the width direction of the capacitor body 25 were both set to approximately 2.23 mm. In the multi-layer capacitors 22 through 24 shown in FIG. 5 through FIG. 7, the dimensions L in the length directions of the capacitor body 25 were set to approximately 3.2 mm, and the dimensions W in the width direction were set to approximately 1.6 mm.

In all of the multi-layer capacitors 21 through 24, the dimension in the thickness direction of the capacitor body 25 was set to approximately 0.5 mm.

Although not shown, each internal electrode of all multi-layer capacitors 21 through 24 included four layers, and overlapping areas were set to the same size to provide a capacitance of about 8.9 pF. A thickness of the dielectric layers of all the multi-layer capacitors 21 through 24 was set to about 0.1 mm. The dielectric layers were made of a dielectric having a dielectric constant of 10.

In all of the multi-layer capacitors 21 through 24, the widths of the first and second external electrode terminals 30 and 31 were set to about 0.2 mm. The first and second external electrode terminals 30 and 31 were disposed so that they alternate adjacently.

A total of eight first and second external electrode terminals 30 and 31 were provided in the multi-layer capacitors 21 through 23, and a total of twelve first and second external electrode terminals 30 and 31 were provided in the multi-layer capacitor 24.

A value of ESL of each of the multi-layer capacitors 21 through 24 constructed as described above was determined. The measured resonance frequency was about 8.9 GHz, and ESL was about 36 pH in the multi-layer capacitor 21 according to the example of a preferred embodiment of the present invention shown in FIG. 4.

In the multi-layer capacitor 22, which is a comparative example shown in FIG. 5, the resonance frequency was 5.0 GHz and ESL was 114 pH.

In the multi-layer capacitor 23, which is a comparative example shown in FIG. 6, the resonance frequency was 6.2 GHz, and ESL was 74 pH.

In the multi-layer capacitor 24, which is a comparative example shown in FIG. 7, the resonance frequency was 8.0 GHz, and ESL was 45 pH.

Thus, it is clear that the multi-layer capacitor 21 provided with the capacitor body 25 in which the dimension L in the length direction and the dimension W in the width direction are substantially the same achieves much lower ESL than in any of the multi-layer capacitors 22 through 24 provided with the capacitor bodies 25 in which the dimension L in the length direction is larger than the dimension W in the width direction. It should be noted, in particular, that, when the multi-layer capacitor 21 is compared with the multi-layer capacitor 24, the capacitor 21 provides lower ESL than the capacitor 24 even though the capacitor 24 has more external electrode terminals 30 and 31.

Subsequently, ESL values were determined under different dimensions in the length direction and in the width direction of the capacitor bodies, i.e. different dimensions of a plane of the capacitor body, different numbers of the lead-out portions of the internal electrodes extending onto surfaces, and different widths of the lead-out portions, while the dimension in the length direction and the dimension in the width direction of the capacitor body were set to the same in all cases. The results are shown in Table 2 below.

TABLE 2

| Sample No. | Planar Dimension of Capacitor Body | No. of Lead-Out Portions of Internal Electrodes Onto Surfaces | Width of Lead-Out Portion | ESL |
| --- | --- | --- | --- | --- |
| 1 | 1.5 mm | 2 | 0.1 mm | 63.6 pH |
| 2 | 1.5 mm | 2 | 0.2 mm | 47.6 pH |
| 3 | 2.0 mm | 2 | 0.5 mm | 36.1 pH |
| 4 | 2.0 mm | 3 | 0.1 mm | 28.4 pH |
| 5 | 2.0 mm | 3 | 0.2 mm | 19.7 pH |
| 6 | 2.0 mm | 4 | 0.05 mm | 20.1 pH |

Table 2 reveals the following.

First, regarding a relationship between the number of lead-out portions extending onto the surfaces of the internal electrodes and ESL, the ESL decreases as the number of the lead-out portions increases. This is because dispersion of current is increased as the number of the lead-out portions or the number of the external electrode terminals is increased, so that the number of locations where electric fields are canceled increases.

However, as can be understood by comparing sample Nos. 5 and 6 in Table 1, when the number of the lead-out portions of each internal electrode is four, the reduction in ESL is leveled off as compared with a case wherein the number of the lead-out portions is three. This happens because, as more lead-out portions are added, the width of each lead-out portion inevitably becomes smaller, and electric fields will concentrate at the narrower lead-out portions. As a result, ESL increases, thus canceling the effect that is expected to be enhanced by increasing the number of the lead-out portions.

Regarding a relationship between the width of the lead-out portions and ESL, it can be seen from a comparison between sample Nos. 1 and 2 or a comparison between sample Nos. 4 and 5 in Table 1 that, if the number of the lead-out portions is the same, then ESL can be reduced further because the lead-out portions are broader. This is because inductance components become smaller as the lead-out portions are broader, and the concentration of electric fields is weakened.

Thus, when the width of the lead-out portions is taken into account, the number of the lead-out portions onto the surfaces of the internal electrodes is preferably four or less in these preferred embodiments.

Figure 8:
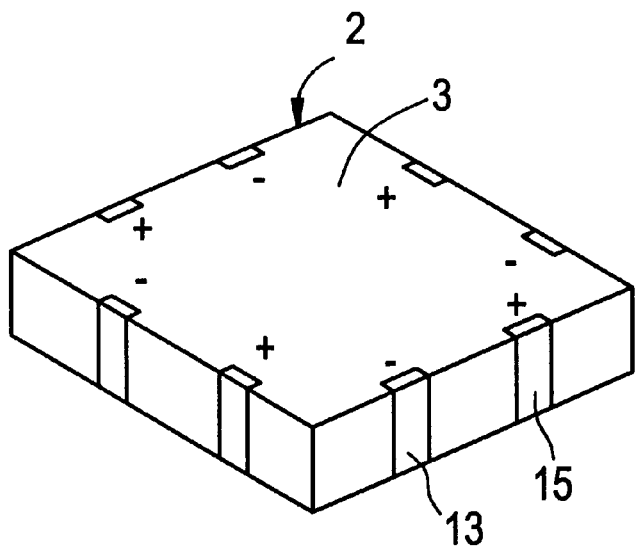
FIG. 8 shows a further preferred embodiment of the present invention.
Figure 9:
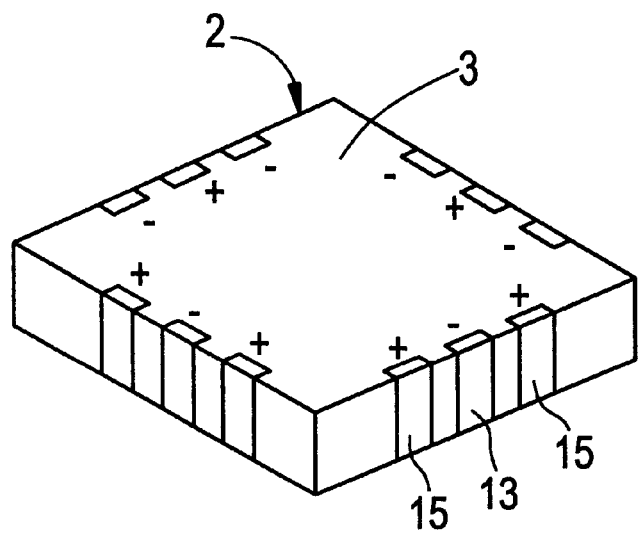
FIG. 9 shows a further preferred embodiment of the present invention.
Figure 10:
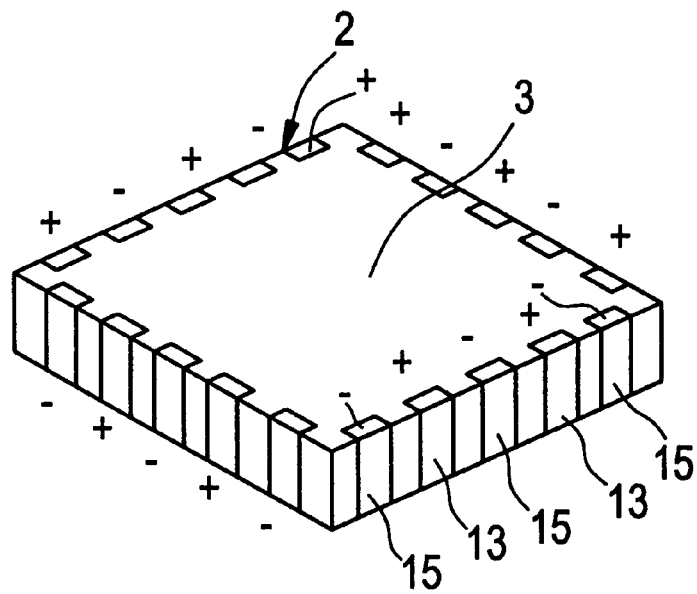
FIG. 10 shows yet another preferred embodiment of the present invention.

Other preferred embodiments are possible and shown in FIGS. 8–10. More specifically, FIG. 8 shows a preferred embodiment of a capacitor device which is similar to that shown in FIG. 1, however, the capacitor device shown in FIG. 8 has only two external terminal electrodes on each of the four sides of the capacitor body. FIG. 8 is similar to the experimental device according to preferred embodiments shown in FIG. 4 and described above. Note that the arrangements shown in FIGS. 1 and 8 include an even number of external electrode terminals on each of the four sides of the capacitor body and also have an equal number of external electrode terminals, i.e. two, on the four sides of the capacitor body.

FIGS. 9 and 10 show further preferred embodiments of the present invention in which an odd number greater than two of external electrode terminals is provided on each of the four sides of the substantially-square ceramic body. As seen in FIG. 9, a total of three external electrode terminals is provided on each of the four sides of the substantially-square capacitor body and in FIG. 10, a total of five external electrode terminals is provided on each of the four sides of the substantially-square capacitor body.

Figure 11:
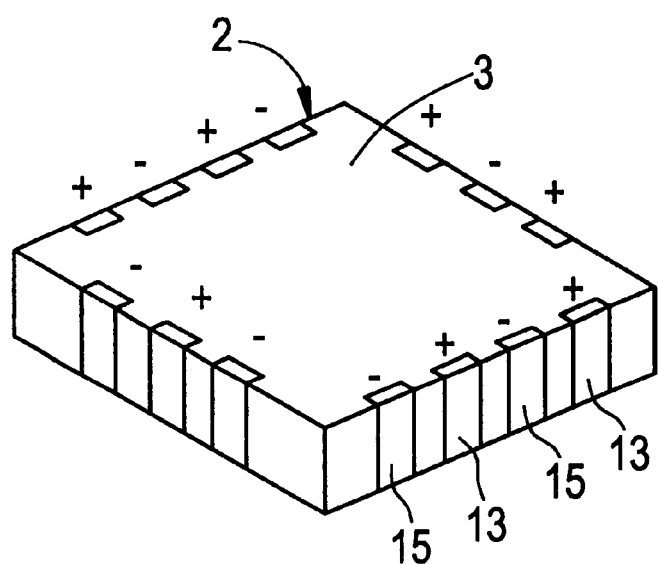
FIG. 11 shows another preferred embodiment of the present invention.

FIG. 11 shows a further preferred embodiment in which a first pair of opposite sides of the substantially-square ceramic body has an odd number greater than two of external electrode terminals and a second pair of oppositely sides of the substantially-square ceramic body has an even number greater than two of external electrode terminals. In the case of FIG. 11, there are three external electrode terminals provided on two of the four sides of the substantially-square capacitor body and four external electrode terminals provided on the remaining two of the four sides of the substantially-square capacitor body. However, any combination of odd and even number external electrode terminals may be provided on the four sides of the substantially-square capacitor body.

The above descriptions have been provided in conjunction with the preferred embodiments illustrating the present invention. Within the scope of the present invention, the number or positions of the lead-out portions of the internal electrodes may be changed, and the number or positions of the external electrode terminals may accordingly be changed.

Furthermore, the number of the lead-out portions extending onto the first and second side surfaces of the capacitor body and the number of the corresponding external electrode terminals do not necessarily have to be the same as the number of the lead-out portions extended onto the first and second end surfaces of the capacitor body and the number of the corresponding external electrode terminals. For instance, while the first and second side surfaces of the capacitor body have four lead-out portions and four external electrode terminals, the first and second end surfaces may have two lead-out portions and two external electrode terminals.

Moreover, although not shown, a plurality of opposing portions of the first internal electrodes and the second internal electrodes may be used to define a plurality of capacitor units in order to obtain a larger capacitance. When a plurality of opposing portions of the first internal electrodes and the second internal electrodes are provided, the resulting plurality of capacitor units are connected in parallel by external electrode terminals.

Figure 12:
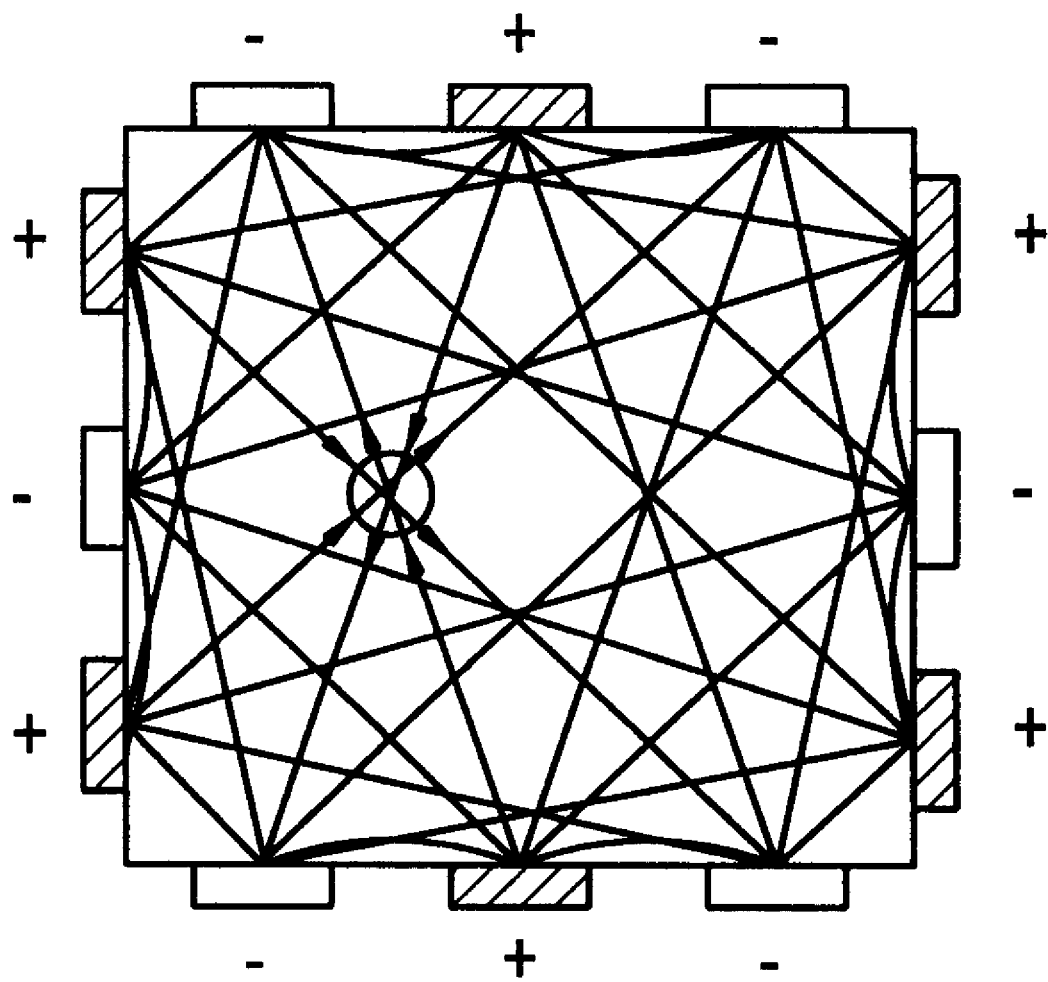
FIG. 12 is a view showing how electric current flows in the multi-layer capacitor of FIG. 9.

FIG. 12 is an explanation view which illustrates how the structure of the preferred embodiments described above achieve very low ESL. More specifically, FIG. 12 shows electric current flowing in the internal electrodes of the multi-layer capacitor such as that shown in FIG. 9, for example. The polarities of the external electrode terminals are shown by the symbols "+" and "−".

As shown by the arrows in FIG. 12, current flows from positive terminals to negative terminals. It should be noted that the current is not limited to direct current and may be alternating current in which opposite current flow would occur.

As is known, when current flows, magnetic flux determined by the direction of the current is induced, thereby generating the self-inductance components. In FIG. 12, at a central portion O of the internal electrode, electric currents flow in various directions. Therefore, the magnetic fluxes induced by the electric currents are cancelled and the magnetic fluxes are not generated.

As described above, self-inductance currents are minimized in the multi-layer capacitor according to preferred embodiments of the present invention to achieve very low ESL.

Figure 14:
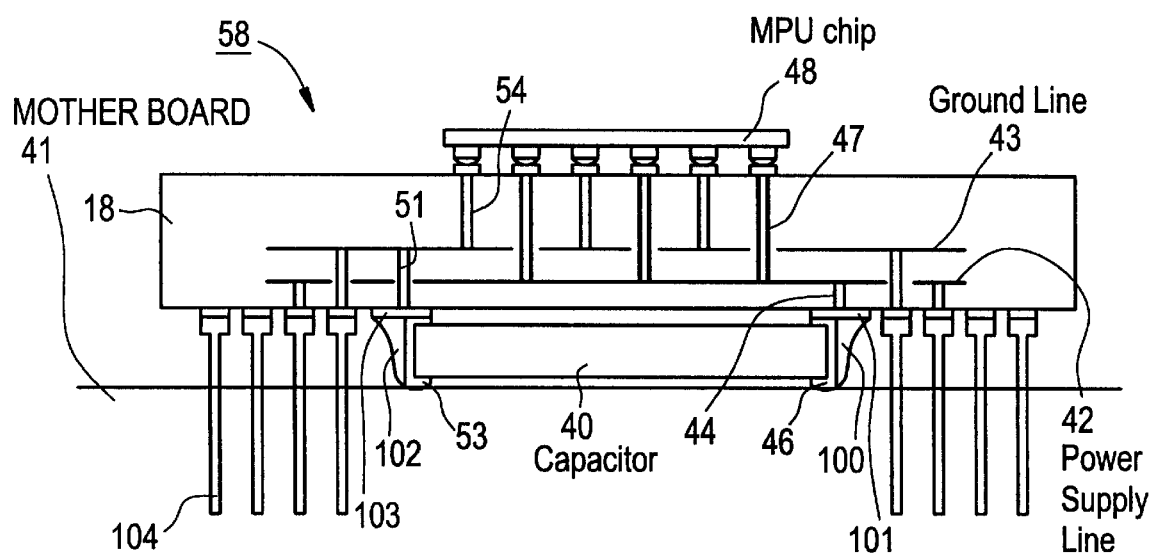
FIG. 14 is a sectional view showing a construction of an MPU wherein a multi-layer capacitor of another preferred embodiment of the present invention defines a decoupling capacitor included in the MPU.
Figure 15:
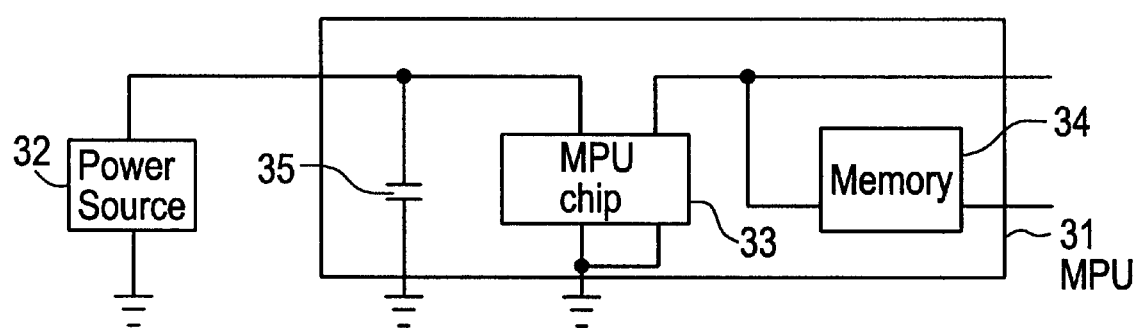
FIG. 15 is a block diagram showing a connection construction of an MPU and a power source.

A multi-layer capacitor according to a preferred embodiment of the present invention is useful as a decoupling capacitor 35 for the MPU chip 33 shown in FIG. 15. The structure of the MPU that includes the multi-layer capacitor as a decoupling capacitor is now discussed referring to FIG. 13 and 14.

Figure 13:
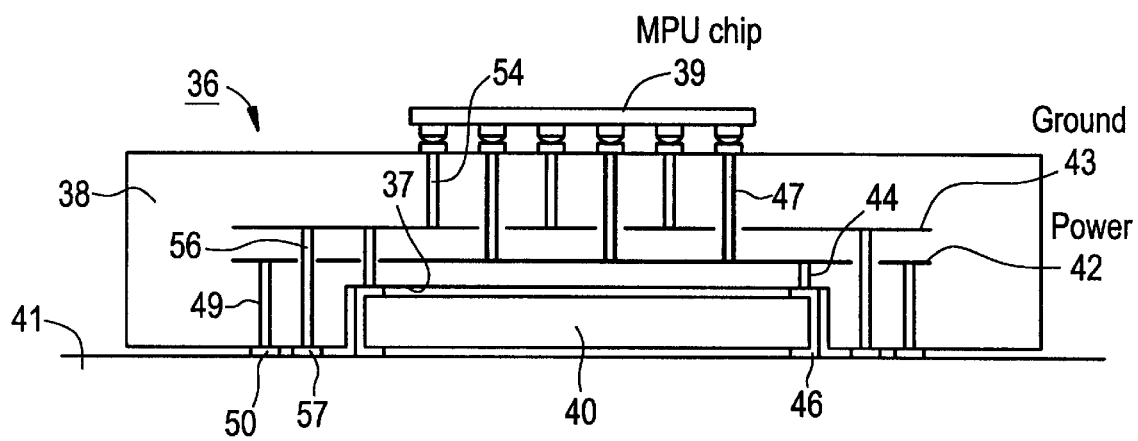
FIG. 13 is a sectional view showing a construction of an MPU wherein a multi-layer capacitor of a preferred embodiment of the present invention defines a decoupling capacitor included in the MPU.

Referring to FIG. 13, the MPU 36 includes a multi-layer wiring board 38 having a cavity 37 on its lower surface. An MPU chip 39 is surface-mounted on the wiring board 38. A multi-layer capacitor 40 according to a preferred embodiment of the present invention functioning as a decoupling capacitor is housed in the cavity 37 of the wiring board 38. The wiring board 38 is surface-mounted on a mother board 41.

As diagrammatically shown, wiring conductors required for the MPU 36 are provided on the surface of or inside of the wiring board 38. Through these wiring conductors, the connections shown in FIG. 15 are achieved.

Now, typical connections are described. A power supply hot electrode 42 and a ground electrode 43 are formed inside of the wiring board 38.

The power supply hot electrode 42 is electrically connected to a particular side terminal electrode 46 of the multi-layer capacitor 40 through a via hole conductor 44, is electrically connected to a particular terminal 48 of the MPU chip 39 through a via hole conductor 47, and is further electrically connected to a hot conductor land 50 of the mother board 41 through a via hole conductor 47.

The ground electrode 43 is electrically connected to a particular side terminal electrode 53 of the multi-layer capacitor 40 through a via hole conductor 51, is electrically connected to a particular terminal 55 of the MPU chip 39 through a via hole conductor 54, and is further electrically connected to a ground conductor land 57 of the mother board 41 through a via hole conductor 56.

A memory corresponding to the memory 34 shown in FIG. 15 is not shown in FIG. 13.

The MPU 58 shown in FIG. 14 and the MPU 36 shown in FIG. 13 have several common components. Like components are designated with like reference numerals and repetition of description of these components is avoided.

A side terminal 46 is electrically connected through a solder joint 100 to a land 101 to which a power supply hot electrode 42 is connected. A side terminal 53 is electrically connected through a solder joint 102 to a land 103 to which a ground electrode 43 is connected. The MPU 58 is electrically connected to a mother board 41 through pins 104 arranged on the underside of a multi-layer wiring board 38.

Figure 16:
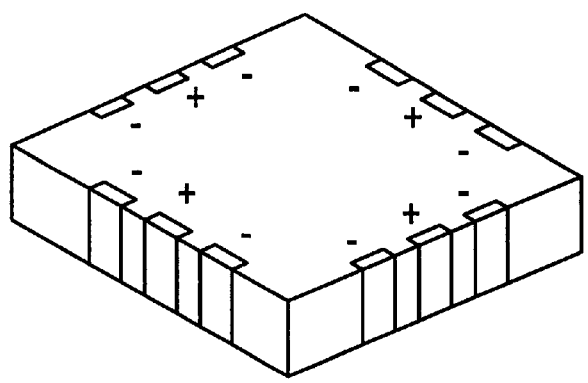
FIG. 16 shows still another preferred embodiment of the present invention.
Figure 17:
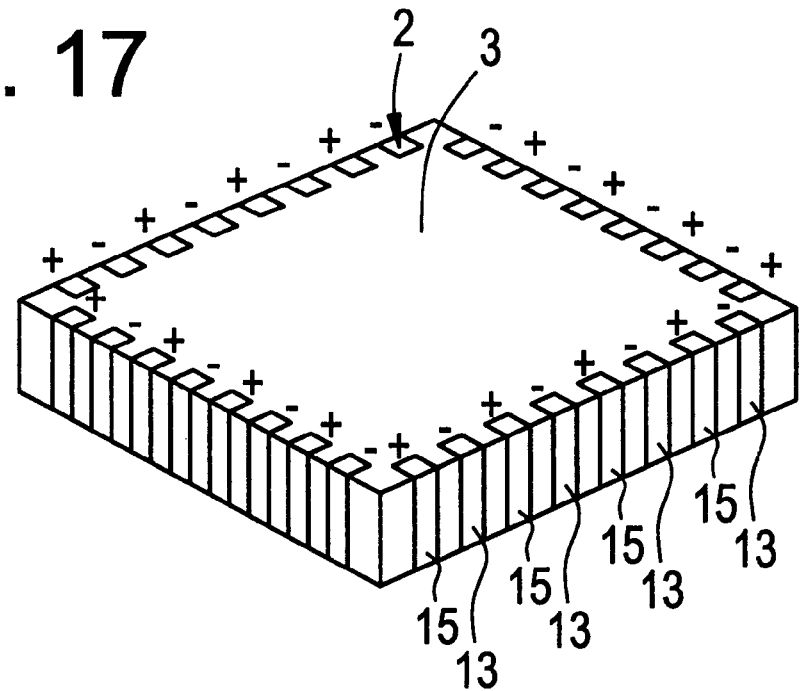
FIG. 17 shows another preferred embodiment of the present invention.
Figure 18:
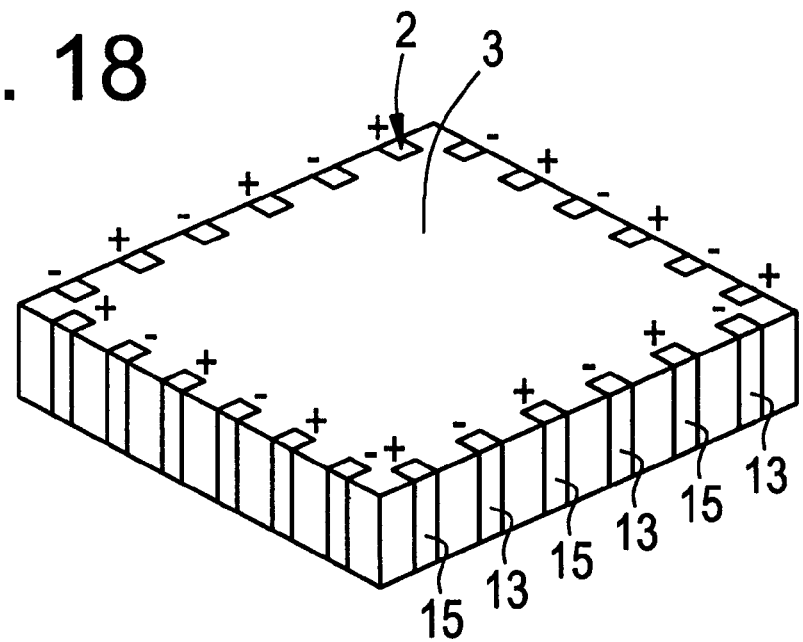
FIG. 18 shows still another preferred embodiment of the present invention.

A memory corresponding to the memory 34 shown in FIG. 15 is not shown in FIG. 14. Further, the arrangement of the polarity shown in FIG. 16 is also possible.

As described above, in the multi-layer capacitor in accordance with preferred embodiments of the present invention, the dimension in the length direction and the dimension in the width direction of the capacitor body are substantially equal, and the internal electrodes preferably have substantially square patterns. The first internal electrodes have first lead-out portions respectively extended onto the two side surfaces and the two end surfaces of the capacitor body, and the second internal electrodes also have second lead-out portions respectively extended onto the two side surfaces and the two end surfaces of the capacitor body. The first external electrode terminals that are electrically connected to the first lead-out portions and the second external electrode terminals that are electrically connected to the second lead-out portions are arranged so that they alternate adjacently on the side surfaces and the end surfaces of the capacitor body, and are arranged so that opposite polarity terminals are disposed directly across from each other via the capacitor body.

Thus, in the multi-layer capacitor in accordance with preferred embodiments of the present invention, regarding currents flowing between the first and second external electrode terminals, two adjacent currents connecting two side surfaces and two adjacent currents connecting two end surfaces can be directed in opposite directions from each other. Likewise, currents connecting two side surfaces and currents connecting two end surfaces can be arranged to extend in directions which are substantially perpendicular to each other. Moreover, the length of the current passage connecting the two side surfaces and the length of the current passage connecting the two end surfaces can be substantially equal.

Accordingly, magnetic fluxes generated by these currents can be effectively canceled, allowing the ESL of the multi-layer capacitor to be greatly minimized. As a result, the resonance frequency of the multi-layer capacitor can be increased. This means that frequencies at which the multi-layer capacitor can effectively perform its intended function is greatly increased, enabling the multi-layer capacitor to be successfully used with electronic circuits designed for higher frequencies.

According to preferred embodiments of the present invention, ESL can be further reduced by providing each of the two side surfaces and the two end surfaces of the capacitor body with a plurality of first and second lead-out portions and first and second external electrode terminals.

Furthermore, by providing each of the two side surfaces and the two end surfaces of the capacitor body with four or less of the first and second lead-out portions and first and second external electrode terminals, the ESL can be further reliably reduced without decreasing the width of the lead-out portions, which means the concentration of electric fields on the lead-out portions can be weakened.

Moreover, in preferred embodiments of the present invention, a reduced size and a larger capacity multi-layer capacitor can be effectively achieved by providing a plurality of opposing portions of the first internal electrodes and the second internal electrodes so as to define a plurality of capacitor units connected in parallel by first and second external electrode terminals.

It should be understood that the foregoing description is only illustrative of the preferred embodiments of the present invention. Various alternatives and modifications can be devised by those of skill in the art without departing from the present invention. Accordingly, the present invention is intended to embrace all such alternatives, modifications and variances which fall within the scope of the appended claims.

What is claimed is:

1. A multi-layer capacitor comprising:
   a substantially square capacitor body including four sides having substantially equal lengths, the capacitor body including a plurality of dielectric layers and at least a pair of first and second internal electrodes that oppose each other via one of said dielectric layers to define a capacitor unit, said first internal electrode having first lead-out portions that extend to each of the four sides of the capacitor body, said second internal electrode having second lead-out portions that extend to each of the four sides of the capacitor body, the first and second lead-out portions being arranged to interdigitated with each other;
   first polarity external electrode terminals being electrically connected to said first lead-out portions and arranged on each of said four sides of the capacitor body at locations where said first lead-out portions are provided; and
   second polarity external electrode terminals being electrically connected to said second lead-out portions and arranged on each of said four sides of the capacitor body at locations wherein said second lead-out portions are located; wherein
      on at least each of the four sides of said capacitor body there are at least two of said first polarity external electrode terminals and at least one of said second polarity external electrode terminals located in between said at least two of said first polarity external electrode terminals.

2. The multi-layer capacitor according to claim 1, wherein said first polarity external electrode terminals and said second polarity external electrode terminals are arranged to be directly opposite to each other across the capacitor body.

3. The multi-layer capacitor according to claim 1, wherein at least one of said first polarity external electrode terminals and at least one of said second polarity external electrode terminals are arranged to be adjacent to each other along each of the four sides of the capacitor body.

4. The multi-layer capacitor according to claim 1, wherein said first polarity external electrode terminals and said second polarity external electrode terminals are arranged to be adjacent to each other along the four sides of the capacitor body such that each of the first polarity external electrode terminals is located between a pair of the second polarity external electrode terminals and each of the second polarity external electrode terminals is located between a pair of the first polarity external electrode terminals.

5. The multi-layer capacitor according to claim 1, wherein four of the first polarity external electrode terminals and four of the second polarity external electrode terminals are provided on each of the four sides of the capacitor body.

6. The multi-layer capacitor according to claim 1, wherein an even number of the first polarity external electrode terminals and an even number of the second polarity external electrode terminals are provided on each of the four sides of the capacitor body.

7. The multi-layer capacitor according to claim 1, wherein an even number of the first polarity external electrode terminals and an even number of the second polarity external electrode terminals are provided on each of the four sides of the capacitor body.

8. The multi-layer capacitor according to claim 1, wherein an even number of the first polarity external electrode terminals and an odd number of the second polarity external electrode terminals are provided on two sides of the capacitor body, and an odd number of the first polarity external electrode terminals and an even number of the second polarity external electrode terminals are provided on the other two sides of the capacitor body.

9. The multi-layer capacitor according to claim 1, wherein a number of the first polarity external electrode terminals provided on each of the four sides of the capacitor body is equal to a number of the second polarity external electrode terminals provided on each of the four sides of the capacitor body.

10. The multi-layer capacitor according to claim 1, wherein each of said first and second internal electrodes has a substantially square pattern that has sides extending substantially parallel to said four sides of the capacitor body.

11. The multi-layer capacitor according to claim 1, wherein the first polarity lead-out portions and the second polarity lead-out portions have substantially the same size and dimensions including length and width.

12. The multi-layer capacitor according to claim 1, wherein the dimensions including the length and the width of main portions of the first and second polarity internal electrodes have substantially the same shape and configuration.

13. The multi-layer capacitor according to claim 1, wherein the first polarity external electrode terminals and the second polarity external electrode terminals are arranged symmetrically on the four sides of the capacitor body.

14. The multi-layer capacitor device according to claim 1, wherein the multi-layer capacitor is arranged to define a decoupling capacitor for a multiprocessing unit.

15. A wiring board comprising at least one multi-layer capacitor according to claim 1 mounted thereon.

16. A wiring board according to claim 15, further comprising an MPU chip mounted thereon.

17. A high frequency circuit comprising at least one multi-layer capacitor according to claim 1.

18. The multi-layer capacitor according to claim 1, wherein the first and second lead out portions have a length a and a width b and a ratio a/b is about 3 or less for each of the first and second lead out portions.

19. The multi-layer capacitor according to claim 1, wherein the first and second lead out portions have a length a and a width b and a ratio a/b is about 1.3 or less for each of the first and second lead out portions.

20. A multi-layer capacitor comprising:
a substantially square capacitor body including four sides having substantially equal lengths, the capacitor body including a plurality of dielectric layers and at least a pair of first and second internal electrodes that oppose each other via one of said dielectric layers to define a capacitor unit, said first internal electrode having first lead-out portions that extend to each of the four sides of the capacitor body, said second internal electrode having second lead-out portions that extend to each of the four sides of the capacitor body, the first and second lead-out portions being arranged to be interdigitated with each other;
a plurality of first polarity external electrode terminals being electrically connected to said first lead-out portions and arranged on each of said four sides of the capacitor body at locations where said first lead-out portions are provided; and
a plurality of second polarity external electrode terminals being electrically connected to said second lead-out portions and arranged on each of said four sides of the capacitor body at locations wherein said second lead-out portions are located; wherein
said first polarity external electrode terminals and said second polarity external electrode terminals are arranged to be directly opposite to each other across the capacitor body such that each of said first polarity external electrode terminals is disposed directly opposite to a different one of said second polarity external electrode terminals across the capacitor body, and said first polarity external electrode terminals are arranged adjacent at least one of the second polarity external electrode terminals on each of the four sides of the capacitor body; and
on each of the four sides of said capacitor body there are at least two of said first polarity external electrode terminals and at least one of said second polarity external electrode terminals located in between said at least two of said first polarity external electrode terminals.

21. The multi-layer capacitor according to claim 20, wherein four of the first polarity external electrode terminals and four of the second polarity external electrode terminals are provided on each of the four sides of the capacitor body.

22. The multi-layer capacitor according to claim 20, wherein an even number of the first polarity external electrode terminals and an even number of the second polarity external electrode terminals are provided on each of the four sides of the capacitor body.

23. The multi-layer capacitor according to claim 20, wherein an odd number of the first polarity external electrode terminals and an odd number of the second polarity external electrode terminals are provided on each of the four sides of the capacitor body.

24. The multi-layer capacitor according to claim 20, wherein an even number of the first polarity external electrode terminals and an odd number of the second polarity external electrode terminals are provided on two sides of the capacitor body, and an odd number of the first polarity external terminals and an even number of the second polarity external electrode terminals are provided on the other two sides of the capacitor body.

25. The multi-layer capacitor according to claim 20, wherein a number of the first polarity external electrode terminals provided on each of the four sides of the capacitor body is equal to a number of the second polarity external electrode terminals provided on each of the four sides of the capacitor body.

26. The multi-layer capacitor according to claim 20, wherein each of said first and second internal electrodes has a substantially square pattern that has sides extending substantially parallel to said four sides of the capacitor body.

27. The multi-layer capacitor according to claim 20, wherein the first polarity lead-out portions and the second polarity lead-out portions have substantially the same size and dimensions including length and width.

28. The multi-layer capacitor according to claim 20, wherein the dimensions including the length and the width of the main portions of the first and second polarity internal electrodes have substantially the same shape and configuration.

29. The multi-layer capacitor according to claim 20, wherein the first polarity external electrode terminals and the second polarity external electrode terminals are arranged symmetrically on the four sides of the capacitor body.

30. The multi-layer capacitor device according to claim 20, wherein the multi-layer capacitor is arranged to define a decoupling capacitor for a multiprocessing unit.

31. A wiring board comprising at least one multi-layer capacitor according to claim 20 mounted thereon.

32. A wiring board according to claim 31, further comprising an MPU chip mounted thereon.

33. A high frequency circuit comprising at least one multi-layer capacitor according to claim 20.

34. The multi-layer capacitor according to claim 20, wherein the first and second lead out portions have a length a and a width b and a ratio a/b is about 3 or less for each of the first and second lead out portions.

35. The multi-layer capacitor according to claim 20, wherein the first and second lead out portions have a length a and a width b and a ratio a/b is about 1.3 or less for each of the first and second lead out portions.

36. The multi-layer capacitor according to claim 20, wherein said first polarity external electrode terminals and said second polarity external electrode terminals are arranged to be adjacent to each other along the four sides of the capacitor body.

* * * * *